United States Patent
Zhang et al.

(10) Patent No.: US 11,764,230 B2
(45) Date of Patent: Sep. 19, 2023

(54) ARRAY SUBSTRATE, DISPLAY PANEL, AND DISPLAY DEVICE

(71) Applicants: MIANYANG HKC OPTOELECTRONICS TECHNOLOGY CO., LTD., Sichuan (CN); HKC CORPORATION LIMITED, Shenzhen (CN)

(72) Inventors: Lian Zhang, Sichuan (CN); Guoduo Chen, Sichuan (CN); Haijiang Yuan, Sichuan (CN)

(73) Assignees: MIANYANG HKC OPTOELECTRONICS TECHNOLOGY CO., LTD., Sichuan (CN); HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/090,619

(22) Filed: Dec. 29, 2022

(65) Prior Publication Data
US 2023/0238396 A1 Jul. 27, 2023

(30) Foreign Application Priority Data
Jan. 27, 2022 (CN) .......................... 202210102001.1

(51) Int. Cl.
H01L 27/12 (2006.01)
(52) U.S. Cl.
CPC ................. *H01L 27/1244* (2013.01)
(58) Field of Classification Search
CPC ............. G02F 1/13458; G02F 1/13452; H01L 27/1244
See application file for complete search history.

(56) References Cited

U.S. PATENT DOCUMENTS

2002/0044250 A1*  4/2002  Yoo .................. G02F 1/1345
                                                         349/149
2018/0203288 A1   7/2018  Zhao et al.
(Continued)

FOREIGN PATENT DOCUMENTS

CN       102650776 A    8/2012
CN       104678671 A    6/2015
(Continued)

OTHER PUBLICATIONS

First Office Action issued in corresponding CN Application No. CN202210102001.1, dated Sep. 21, 2022, pp. 1-10, Beijing, China.
(Continued)

*Primary Examiner* — James A Dudek
(74) *Attorney, Agent, or Firm* — HAUPTMAN HAM, LLP

(57) ABSTRACT

An array substrate, a display panel, and a display device are provided. The array substrate has a display region and a non-display region, and the array substrate includes a substrate, a metal layer, an intermediate layer, a conductive film, and a conductive adhesive disposed in the non-display region. The metal layer is disposed on one side of the substrate, and the intermediate layer is disposed on one side of the metal layer away from the substrate. The array substrate defines a groove penetrating through the intermediate layer. The conductive film is disposed on one side of the intermediate layer away from the substrate and extends into the groove, and the conductive adhesive is disposed on one side of part of the conductive film in the groove away from the substrate, and at least extends to an edge of the groove adjacent to the display region.

15 Claims, 3 Drawing Sheets

(56) References Cited

U.S. PATENT DOCUMENTS

2020/0075700 A1    3/2020  Cao et al.
2020/0084899 A1*  3/2020  Kang .................. G02F 1/13458

FOREIGN PATENT DOCUMENTS

| CN | 107978841 A | 5/2018 |
| CN | 108389868 A | 8/2018 |
| CN | 109061935 A | 12/2018 |
| CN | 111640708 A | 9/2020 |
| CN | 113130612 A | 7/2021 |
| CN | 113782546 A | 12/2021 |
| JP | 2015169903 A | 9/2015 |

OTHER PUBLICATIONS

WIPO, International Search Report and Written Opinion for International Application No. PCT/CN2022/137264, dated Mar. 3, 2023.

* cited by examiner

ARRAY SUBSTRATE, DISPLAY PANEL, AND DISPLAY DEVICE

CROSS-REFERENCE TO RELATED APPLICATIONS

This application claims priority under 35 U.S.C. § 119(a) to Chinese Patent Application No. 202210102001.1, filed Jan. 27, 2022, the entire disclosure of which is incorporated herein by reference.

TECHNICAL FIELD

The disclosure relates to the field of display technology, and more particular to an array substrate, a display panel, and a display device.

BACKGROUND

Display technology has always been one of important research directions in display panel. In order to meet bonding and testing requirements of array substrates, the array substrate needs to define a groove in an Outer Lead Bonding (OLB) region of the array substrate to expose a metal part of the array substrate, and then a layer of Indium Tin Oxide (ITO) film is coated to protect exposed metal terminals from corrosion.

In related art, bonding is carried out in the groove in the OLB region, which will easily cause water-vapor corrosion, thus resulting in poor reliability.

SUMMARY

In a first aspect, an array substrate is provided in the disclosure. The array substrate has a display region and a non-display region, and the array substrate includes a substrate, a metal layer, an intermediate layer, a conductive film, and a conductive adhesive disposed in the non-display region. The metal layer is disposed on one side of the substrate, and the intermediate layer is disposed on one side of the metal layer away from the substrate. The array substrate defines a groove penetrating through the intermediate layer. The conductive film is disposed on one side of the intermediate layer away from the substrate and extends into the groove, and the conductive adhesive is disposed on one side of part of the conductive film in the groove away from the substrate, and at least extends to an edge of the groove adjacent to the display region.

In a second aspect, a display panel is provided in the disclosure. The display panel includes a counter substrate, a sealing agent, a liquid crystal layer, and the array substrate in the first aspect, where the counter substrate and the array substrate are arranged opposite to each other through the sealing agent, and the liquid crystal layer is disposed between the array substrate and the counter substrate.

In a third aspect, a display device is provided in the disclosure. The display device includes a backlight module and the display panel in the third aspect, and the display panel is disposed at a light-emitting side of the backlight module.

BRIEF DESCRIPTION OF THE DRAWINGS

To illustrate technical solutions of implementations of the disclosure more clearly, the following will give a brief introduction to accompanying drawings used for illustrating implementations. Apparently, the accompanying drawings hereinafter illustrated are some implementations of the disclosure. Based on these drawings, those of ordinary skill in the art can also obtain other drawings without creative effort.

Description of reference signs of the accompanying drawings: array substrate—1, display region—1a, non-display region—1b, groove—1c, bonding region—1d, substrate—11, metal layer—12, intermediate layer—13, insulation layer—131, passivation layer—132, planarization layer—133, conductive film—14, conductive adhesive—15, body—151, adhesive-overflow—152, extended part—153, optical adhesive—16, chip-on-film—17, display panel—2, counter substrate—21, sealing agent—22, liquid crystal layer—23, display device—3, backlight module—31.

DETAILED DESCRIPTION

The following will illustrate clearly and completely technical solutions of implementations of the disclosure with reference to accompanying drawings of implementations of the disclosure. Apparently, implementations illustrated herein are merely some implementations, rather than all implementations, of the disclosure. Based on the implementations of the disclosure, all other implementations obtained by those of ordinary skill in the art without creative effort shall fall within the protection scope of the disclosure.

The inventor finds during research that a long groove (generally between 1,280 μm and 1,350 μm) is defined in an OLB region, when bonding is carried out in the groove, a high temperature and pressure of a hot-pressing head would cause Anisotropic Conductive Film (ACF) adhesive to form adhesive-overflow, and the adhesive-overflow would be at a bottom of the groove due to the size of the groove. In this way the adhesive-overflow of the ACF adhesive would form a step with respect to the bottom of the groove, which would further affect fluidity of subsequent sealant in the groove, resulting in bubbles in the sealant and water vapor corrosion of a metal terminal.

Figure 1:
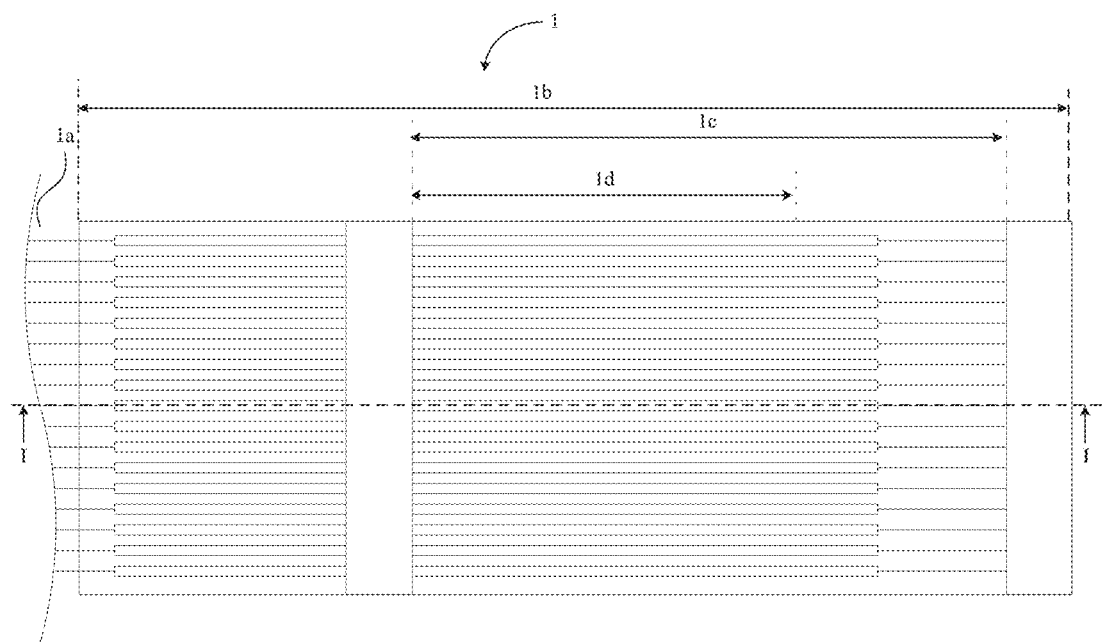
FIG. 1 is a partial plan view of an array substrate provided in an implementation of the present disclosure.
Figure 2:
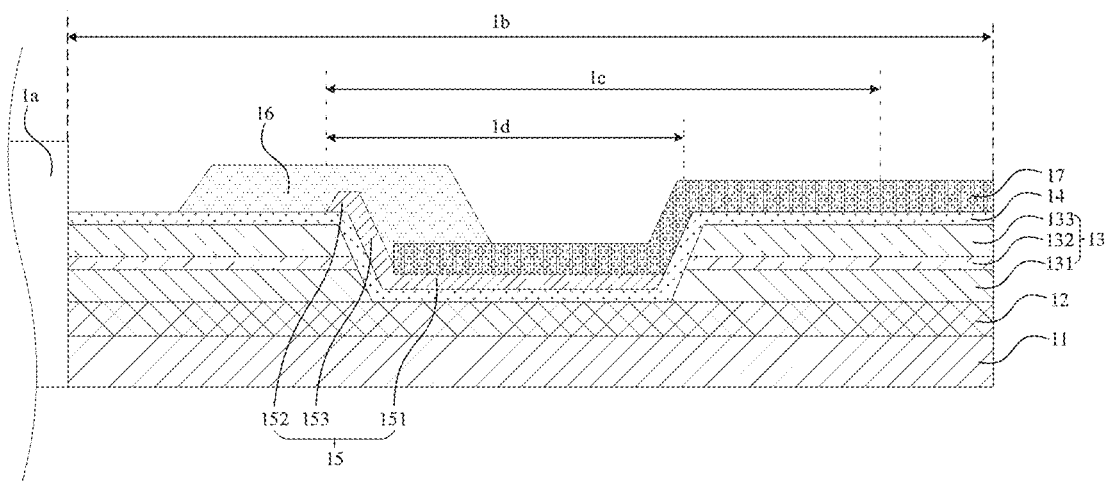
FIG. 2 is a schematic cross-sectional view taken along line I-I in FIG. 1.

An array substrate 1 is provided in this disclosure, and reference is made to FIG. 1 and FIG. 2 together. FIG. 1 is a partial plan view of the array substrate provided in an implementation of this disclosure and FIG. 2 is a schematic cross-sectional view taken along line I-I in FIG. 1. The array substrate 1 has a display region 1a and a non-display region 1b, and the array substrate 1 includes a substrate 11, a metal layer 12 (that is, a metal terminal described above), an intermediate layer 13, a conductive film 14, and a conductive adhesive 15 disposed in the non-display region 1b. The metal layer 12 is disposed on one side of the substrate 11, and the intermediate layer 13 is disposed on one side of the metal layer 12 away from the substrate 11. The array substrate 1 defines a groove 1c penetrating through the intermediate layer 13. The conductive film 14 is disposed on one side of the intermediate layer 13 away from the substrate 11 and extends into the groove 1c, and the conductive adhesive 15 is disposed on one side of part of the conductive film 14 in the groove 1c away from the substrate 11, and at least extends to an edge of the groove 1c adjacent to the display region 1a.

It should be noted that, in general, the display region 1a serves as a region of the array substrate 1 for displaying pictures, the non-display region 1b surrounds the display region 1a, and a circuit for driving pixels in the display region 1a is disposed in the non-display region 1b. During arrangement of the circuit, which involves a bonding process of chip pins on s chip-on-film 17, the intermediate layer 13 disposed in the non-display region 1b is required to define the groove 1c, so that the metal layer 12 is at least partially exposed in the groove 1c, and the conductive film 14 is plated to protect an exposed part of the metal layer 12.

Specifically, the sealant (i.e., an optical adhesive 16) is usually injected into the groove 1c from one side of the groove 1c adjacent to the display region 1a. The conductive adhesive 15 may be made of ACF. The conductive adhesive 15 is disposed on one side of the conductive film 14 in the groove 1c away from the substrate 11, and extends at least to the edge of the groove 1c adjacent to the display region 1a. That is, the conductive adhesive 15 is adhered to the intermediate layer 13 at the edge of the groove, and the sealant can flow into the bottom of the groove 1c along the conductive adhesive 15 and a side wall of the groove 1c, so as to avoid bubbles being generated.

Specifically, a length of the groove 1c may range from 850 μm to 1000 μm, and in this implementation, the length of the groove 1c is 928 μm. It can be understood that in other possible implementations, the groove 1c may have other lengths, which is not limited in this disclosure.

It can be understood that, in this implementation, the conductive adhesive 15 disposed in the groove 1c extends at least to the edge of the groove 1c adjacent to the display region 1a, thus preventing the conductive adhesive 15 from forming a stepwise structure in the groove region of the intermediate layer 13, enhancing fluidity of the sealant in the groove 1c, preventing the metal layer 12 in the groove 1c from corrosion, and improving quality of the array substrate 1.

In a possible implementation, referring to FIG. 2 again, the conductive adhesive 15 includes a body 151, an adhesive-overflow 152, and an extended part 153. The body 151 is located at a bottom of the groove 1c, and the adhesive-overflow 152 is located at the edge of the groove 1c adjacent to the display region 1a, and is connected with the body 151 through the extended part 153.

It should be noted that when the conductive adhesive 15 is disposed in the groove 1c, the extended part 153 and the adhesive-overflow 152 extending from the body 151 may flow out of the groove 1c for technical reasons. In this disclosure, the adhesive-overflow 152 is used. In this implementation, the adhesive-overflow 152 is disposed at the edge of the groove 1c adjacent to the display region 1a, and is connected with the body 151 through the extended part 153. In other words, the extended part 153 is adhered to the groove region of the intermediate layer 13, avoiding the stepwise structure being formed, so that the sealant can flow into the bottom of the groove 1c where the body 151 is located through the adhesive-overflow 152 and the extended part 153.

In a possible implementation, referring to FIG. 2 again, the intermediate layer 13 includes an insulation layer 131, a passivation layer 132, and a planarization layer 133. The insulation layer 131 is disposed on one side of the metal layer 12 away from the substrate 11, the passivation layer 132 is disposed on one side of the insulation layer 131 away from the substrate 11, and the planarization layer 133 is disposed on one side of the passivation layer 132 away from the substrate 11, and an orthographic projection of the planarization layer 133 on the substrate 11 at least partially overlaps with an orthographic projection of the adhesive-overflow 152 on the substrate 11.

Specifically, the orthographic projection of the planarization layer 133 on the substrate 11 at least partially covers the orthographic projection of the adhesive-overflow 152 on the substrate 11. In other words, there exists the planarization layer 133 under the adhesive-overflow 152 in a stack direction in which the metal layer 12 and the substrate 11 are stacked. Because the intermediate layer 13 defines the groove and the planarization layer 133 is above the insulation layer 131 and the passivation layer 132 in the stack direction, at the inner side wall of the groove 1c, the insulation layer 131 and the passivation layer 132 exceed the planarization layer 133. In other words, the orthographic projection of the planarization layer 133 on the substrate 11 falls in the orthographic projection of the passivation layer 132 on the substrate 11, and the orthographic projection of the passivation layer 132 on the substrate 11 falls in the orthographic projection of the insulation layer 131 on the substrate 11. Therefore, the orthographic projection of the planarization layer 133 on the substrate 11 at least partially covers the orthographic projection of the adhesive-overflow 152 on the substrate 11, so that the extended part 153 is completely adhered to the planarization layer 133, the passivation layer 132, and the insulation layer 131, and the fluidity of the sealant on the extended part 153 can be increased.

In this implementation, the passivation layer 132 may be made of Polytetrafluoroethylene (PFA), and the planarization layer 133 may be made of Polyarylene sulfide (PAS). It can be understood that in other possible implementations, the passivation layer 132 and the planarization layer 133 may be made of other materials, which is not limited in this disclosure.

In a possible implementation, the adhesive-overflow 152 has a shape of any one of trapezoid, triangle, and semicircle.

It should be noted that the shape of the adhesive-overflow 152 refers to a profile in a cross-sectional view. In this implementation, as illustrated in FIG. 2, the adhesive-overflow 152 is trapezoidal, and a right bevel of the adhesive-overflow 152 is substantially parallel to one side of the extended part 153 interfacing with the adhesive-overflow 152, so that the sealant can smoothly flow into the bottom of the groove 1c through the adhesive-overflow 152 and the extended part 153. Similarly, when the adhesive-overflow 152 is trapezoidal, the right bevel of the adhesive-overflow 152 is substantially parallel to the side of the extended part 153 interfacing with the adhesive-overflow 152. When the adhesive-overflow 152 semi-circular, the side of the extended part 153 interfacing with the adhesive-overflow 152 should be tangent to the adhesive-overflow 152.

It can be understood that in other possible implementations, the adhesive-overflow 152 can have other shapes, which is not limited in this disclosure.

In a possible implementation, referring to FIG. 1 and FIG. 2 again, the array substrate 1 further includes a chip-on-film 17, and the array substrate 1 further has a bonding region 1d, the chip-on-film 17 is bonded to the metal layer 12 in the bonding region 1d through the conductive adhesive 15 and the conductive film 14, and the bonding region 1d is located in a region where the groove 1c is defined, and at one side adjacent to the display region 1a, a boundary of the bonding region 1d is flush with a boundary of the region where the groove 1c is located.

It should be noted that the non-display region 1b includes the bonding region 1d, and the bonding region 1d can be considered as part of the non-display region 1b. A chip is usually disposed on the chip-on-film 17, and pins of the chip are bonded to the metal layer 12 in the bonding region 1d through the chip-on-film 17. The conductive adhesive 15 is usually disposed corresponding to the bonding region 1d. In the related art, the boundary of the bonding region 1d is usually not flush with the boundary of the region where the groove 1c is located, so the adhesive-overflow 152 of the conductive adhesive 15 is easy to form the stepwise structure, which affects the fluidity of the sealant.

In this implementation, at one side adjacent to the display region 1a, the boundary of the bonding region 1d is flush with the boundary of the region where the groove 1c is located, in other words, a boundary of the adhesive-overflow 152 adjacent to the display region 1a is flush with the boundary of the region where the groove 1c is located adjacent to the display region 1a; and, the adhesive-overflow 152 of the conductive adhesive 15 disposed in the bonding region 1d easily extends to the edge of the groove 1c adjacent to the display region 1a, so that the sealant injected from the side adjacent to the display region 1a can well flow into the bottom of the groove 1c through the adhesive-overflow 152 and the extended part 153.

In a possible implementation, referring to FIG. 2 again, the array substrate 1 further includes an optical adhesive 16, the optical adhesive 16 is disposed on one side of the conductive film 14 away from the planarization layer 133 and extends into the groove 1c to cover the conductive adhesive 15 and the chip-on-film 17.

In this implementation, the optical adhesive 16 serves as the sealant for the array substrate 1, and the optical adhesive 16 has adhesion and light transmittance. It can be understood that with double isolation protection of the optical adhesive 16 and the conductive adhesive 15, external water vapor can be isolated, the pins of chip on the metal layer 12 and the chip-on-film 17 are prevented from corrosion, and the quality of the array substrate 1 can be improved.

Figure 3:
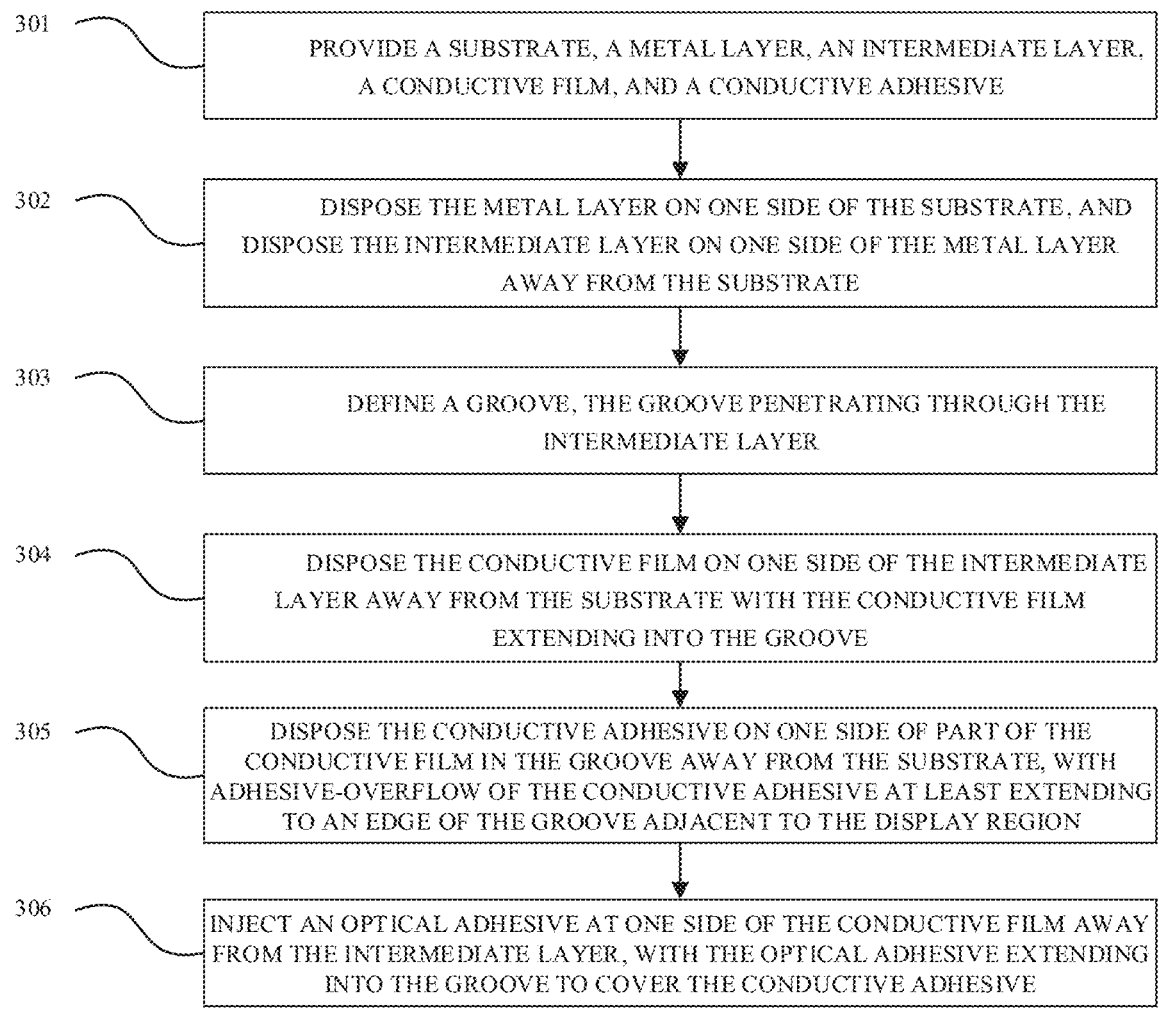
FIG. 3 is a schematic flowchart of a preparation method of an array substrate provided in an implementation of the present disclosure.

A preparation method of an array substrate is further provided in the disclosure, and reference is made to FIG. 3, which is a schematic flow chart of a preparation method of an array substrate provided in an implementation of the present disclosure. The preparation method of the array substrate includes operations at blocks 301, 302, 303, 304 and 305, which will be described in detail in the following.

At block 301, a substrate, a metal layer, an intermediate layer, a conductive film, and a conductive adhesive are provided.

At block 302, the metal layer is disposed on one side of the substrate, and the intermediate layer is disposed on one side of the metal layer away from the substrate.

At block 303, a groove is defined, and the groove penetrates through the intermediate layer.

At block 304, the conductive film is disposed on one side of the intermediate layer away from the substrate with the conductive film extending into the groove.

At block 305, the conductive adhesive is disposed on one side of part of the conductive film in the groove away from the substrate, with adhesive-overflow of the conductive adhesive at least extending to an edge of the groove adjacent to the display region.

Specifically, the substrate 11, reference of the metal layer 12, the intermediate layer 13, the conductive film 14, the conductive adhesive 15, and the groove 1c can be made to above description, which will not be repeatedly described here again. It can be understood that, in this implementation, the conductive adhesive 15 disposed in the groove 1c extends at least to the edge of the groove 1c adjacent to the display region 1a, thus preventing the conductive adhesive 15 from forming the stepwise structure in the groove region of the intermediate layer 13, enhancing fluidity of the sealant in the groove 1c, preventing the metal layer 12 in the groove 1c from corrosion, and improving quality of the array substrate 1.

In a possible implementation, referring to FIG. 3 again, the preparation method of the array substrate further includes operations at block 306, which will be described in detail in the following.

At block 306, an optical adhesive is injected at one side of the conductive film away from the intermediate layer, with the optical adhesive extending into the groove to cover the conductive adhesive.

Reference of the optical adhesive 16 can be made to above description, which will not be repeatedly described here again. It can be understood that in this implementation, with double isolation protection of the optical adhesive 16 and the conductive adhesive 15, external water vapor can be isolated, the chip pins on the metal layer 12 and the chip-on-film 17 are prevented from corrosion, and the quality of the array substrate 1 can be improved.

Figure 4:
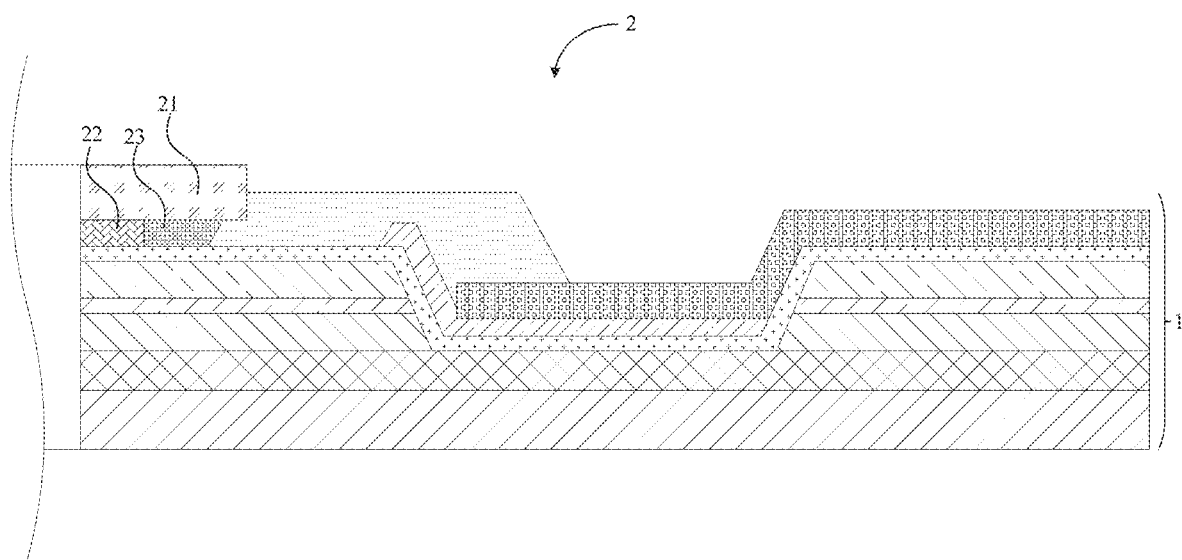
FIG. 4 is a schematic cross-sectional view of a display panel provided in an implementation of the present disclosure.

A display panel 2 is further provided in the disclosure. Reference is made to FIG. 4, which is a schematic cross-sectional view of a display panel provided in an implementation of the present disclosure. The display panel 2 includes a counter substrate 21, a sealing agent 22, a liquid crystal layer 23, and the array substrate 1 as described above. The counter substrate 21 and the array substrate 1 are arranged opposite to each other through the sealing agent 22, and the liquid crystal layer 23 is disposed between the array substrate 1 and the counter substrate 21. Reference of the array substrate 1 can be made to above description, which will not be repeatedly described here again.

Specifically, it is a process technology for the counter substrate 21 and the array substrate 1 to be arranged opposite to each other through the sealing agent 22, so that the counter substrate 21 and the array substrate 1 can be aligned and arranged in fixed relative positions. The counter substrate 21 serves as a Color Filter (CF) of the display panel 2 to filter light. In this implementation, at least part of the optical adhesive 16 is also configured to carry the counter substrate 21. Meanwhile, the sealing agent 22 prevents the optical adhesive 16 from entering the display region 1a.

Figure 5:
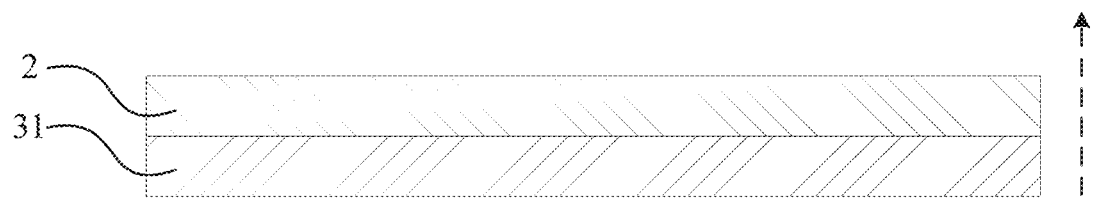
FIG. 5 is a schematic cross-sectional view of a display device provided in an implementation of the present disclosure.

A display device 3 is further provided in the disclosure. Reference is made to FIG. 5, which is a schematic cross-sectional view of a display device provided in an implementation of the present disclosure. The display device 3 includes a backlight module 31 and the display panel 2 described above, and the display panel 2 is disposed on a light-emitting side of the backlight module 31. Reference of the display panel 2 can be made to above description, which will not be repeatedly described here again.

Specifically, reference of a light emitting direction of the backlight module 31 can be made to a dotted arrow in FIG. 5, that is, the light-emitting side of the backlight module 31 is a side adjacent to the display panel 2. The backlight module 31 is configured to provide lights for the display panel 2, so that a user can observe light emitted from the light-emitting side of the backlight module 31 and processed by the display panel 2, thereby realizing display function of the display device 3.

It should be noted that the display device 3 in the implementation of the present disclosure can be a display device 3 in devices such as mobile phones, smart phones, tablet computers, e-readers, wearable portable devices, notebook computers, etc., which can be communicated with a data transfer server through Internet. The data transfer server may be an instant messaging server, a Social Networking Services (SNS) server, etc., which is not limited in implementations of this disclosure.

Principles and implementation manners of the disclosure are elaborated with specific implementations herein. The illustration of implementations above is only used to help understanding of core ideas of the disclosure. At the same time, for those of ordinary skill in the art, according to ideas of the disclosure, there will be changes in the specific implementation manners and application scopes. In summary, contents of this specification should not be understood as limitation on the disclosure.

What is claimed is:

1. An array substrate,
   wherein the array substrate has a display region and a non-display region, and comprises a substrate, a metal layer, an intermediate layer, a conductive film, and a conductive adhesive disposed in the non-display region,
   wherein the metal layer is disposed on one side of the substrate, and the intermediate layer is disposed on one side of the metal layer away from the substrate; the array substrate defines a groove penetrating through the intermediate layer; and the conductive film is disposed on one side of the intermediate layer away from the substrate and extends into the groove, and the conductive adhesive is disposed on one side of part of the conductive film in the groove away from the substrate, and at least extends to an edge of the groove adjacent to the display region, and
   wherein the array substrate further comprises:
     a chip-on-film, wherein the array substrate further has a bonding region, the chip-on-film is bonded to the metal layer in the bonding region through the conductive adhesive and the conductive film, and the bonding region is located in a region where the groove is defined, and a boundary of the bonding region adjacent to the display region is flush with a boundary of the region where the groove is located adjacent to the display region; and
     an optical adhesive, the optical adhesive being disposed on one side of the conductive film away from a planarization layer of the intermediate layer and extending into the groove to cover the conductive adhesive and the chip-on-film.

2. The array substrate of claim 1, wherein the conductive adhesive comprises a body, an adhesive-overflow, and an extended part, wherein the body is located at a bottom of the groove, and the adhesive-overflow is located at the edge of the groove adjacent to the display region, and is connected with the body through the extended part.

3. The array substrate of claim 2, wherein the intermediate layer comprises an insulation layer, a passivation layer, and the planarization layer, wherein the insulation layer is disposed on one side of the metal layer away from the substrate, the passivation layer is disposed on one side of the insulation layer away from the substrate, and the planarization layer is disposed on one side of the passivation layer away from the substrate; and an orthographic projection of the planarization layer on the substrate at least partially overlaps with an orthographic projection of the adhesive-overflow on the substrate.

4. The array substrate of claim 3, wherein the orthographic projection of the planarization layer on the substrate falls in the orthographic projection of the passivation layer on the substrate, and the orthographic projection of the passivation layer on the substrate falls in the orthographic projection of the insulation layer on the substrate.

5. The array substrate of claim 4, wherein the extended part is adhered to the planarization layer, the passivation layer, and the insulation layer.

6. The array substrate of claim 2, wherein the adhesive-overflow has a shape of any one of trapezoid, triangle, and semicircle.

7. A display panel, comprising:
   a counter substrate;
   a sealing agent;
   an array substrate arranged opposite to the counter substrate through the sealing agent; and
   a liquid crystal layer disposed between the array substrate and the counter substrate;
   wherein the array substrate has a display region and a non-display region, and comprises a substrate, a metal layer, an intermediate layer, a conductive film, and a conductive adhesive disposed in the non-display region, wherein the metal layer is disposed on one side of the substrate, and the intermediate layer is disposed on one side of the metal layer away from the substrate; the array substrate defines a groove penetrating through the intermediate layer; and the conductive film is disposed on one side of the intermediate layer away from the substrate and extends into the groove, and the conductive adhesive is disposed on one side of part of the conductive film in the groove away from the substrate, and at least extends to an edge of the groove adjacent to the display region, and
   wherein the array substrate further comprises:
     a chip-on-film, wherein the array substrate further has a bonding region, the chip-on-film is bonded to the metal layer in the bonding region through the conductive adhesive and the conductive film, and the bonding region is located in a region where the groove is defined, and a boundary of the bonding region adjacent to the display region is flush with a boundary of the region where the groove is located adjacent to the display region; and
     an optical adhesive, the optical adhesive being disposed on one side of the conductive film away from a planarization layer and extending into the groove to cover the conductive adhesive and the chip-on-film.

8. The display panel of claim 7, wherein the conductive adhesive comprises a body, an adhesive-overflow, and an extended part, wherein the body is located at a bottom of the groove, and the adhesive-overflow is located at the edge of the groove adjacent to the display region, and is connected with the body through the extended part.

9. The display panel of claim 8, wherein the intermediate layer comprises an insulation layer, a passivation layer, and the planarization layer, wherein the insulation layer is disposed on one side of the metal layer away from the substrate, the passivation layer is disposed on one side of the insulation layer away from the substrate, and the planarization layer is disposed on one side of the passivation layer away from the substrate; and an orthographic projection of the planarization layer on the substrate at least partially overlaps with an orthographic projection of the adhesive-overflow on the substrate.

10. The display panel of claim 9, wherein the orthographic projection of the planarization layer on the substrate falls in the orthographic projection of the passivation layer on the substrate, and the orthographic projection of the passivation layer on the substrate falls in the orthographic projection of the insulation layer on the substrate.

11. The display panel of claim 10, wherein the extended part is adhered to the planarization layer, the passivation layer, and the insulation layer.

12. The display panel of claim 8, wherein the adhesive-overflow has a shape of any one of trapezoid, triangle, and semicircle.

13. A display device, comprising a backlight module and a display panel, the display panel being disposed at a light-emitting side of the backlight module;
wherein the display panel comprises a counter substrate, a sealing agent, a liquid crystal layer, and an array substrate,
wherein the counter substrate and the array substrate are arranged opposite to each other through the sealing agent, and the liquid crystal layer is disposed between the array substrate and the counter substrate,
wherein the array substrate has a display region and a non-display region, and comprises a substrate, a metal layer, an intermediate layer, a conductive film, and a conductive adhesive disposed in the non-display region,
wherein the metal layer is disposed on one side of the substrate, and the intermediate layer is disposed on one side of the metal layer away from the substrate; the array substrate defines a groove penetrating through the intermediate layer; and the conductive film is disposed on one side of the intermediate layer away from the substrate and extends into the groove, and the conductive adhesive is disposed on one side of part of the conductive film in the groove away from the substrate, and at least extends to an edge of the groove adjacent to the display region, and
wherein the array substrate further comprises:
a chip-on-film, wherein the array substrate further has a bonding region, the chip-on-film is bonded to the metal layer in the bonding region through the conductive adhesive and the conductive film, and the bonding region is located in a region where the groove is defined, and a boundary of the bonding region adjacent to the display region is flush with a boundary of the region where the groove is located adjacent to the display region; and
an optical adhesive, the optical adhesive being disposed on one side of the conductive film away from a planarization layer and extending into the groove to cover the conductive adhesive and the chip-on-film.

14. The display device of claim 13, wherein the conductive adhesive comprises a body, an adhesive-overflow, and an extended part, wherein the body is located at a bottom of the groove, and the adhesive-overflow is located at the edge of the groove adjacent to the display region, and is connected with the body through the extended part.

15. The display device of claim 14, wherein the intermediate layer comprises an insulation layer, a passivation layer, and the planarization layer, wherein the insulation layer is disposed on one side of the metal layer away from the substrate, the passivation layer is disposed on one side of the insulation layer away from the substrate, and the planarization layer is disposed on one side of the passivation layer away from the substrate; and an orthographic projection of the planarization layer on the substrate at least partially overlaps with an orthographic projection of the adhesive-overflow on the substrate.

* * * * *